United States Patent
Jung (10) Patent No.: US 7,473,639 B2
(45) Date of Patent: Jan. 6, 2009

(54) METHOD OF FORMING DUAL DAMASCENE PATTERN

(75) Inventor: Suk Won Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/546,804

(22) Filed: Oct. 11, 2006

(65) Prior Publication Data

US 2007/0082481 A1    Apr. 12, 2007

(30) Foreign Application Priority Data

Oct. 11, 2005    (KR) ...................... 10-2005-0095423

(51) Int. Cl.
  *H01L 21/4763*    (2006.01)
(52) U.S. Cl. .................................... 438/629
(58) Field of Classification Search ................ 438/629, 438/623, 624, 633, 638, 692; 257/E21.579
  See application file for complete search history.

(56) References Cited

U.S. PATENT DOCUMENTS

| 7,192,531 B1* | 3/2007 | Kang et al. .................. 216/37 |
|---|---|---|
| 2003/0073321 A1* | 4/2003 | Boiteux et al. .............. 438/710 |
| 2004/0038540 A1* | 2/2004 | Li et al. ....................... 438/700 |
| 2004/0121578 A1* | 6/2004 | Nam ........................... 438/622 |
| 2005/0003675 A1* | 1/2005 | Carducci et al. ............. 438/710 |
| 2005/0079717 A1* | 4/2005 | Savas et al. .................. 438/689 |
| 2005/0205519 A1* | 9/2005 | Kim et al. ...................... 216/67 |
| 2006/0118519 A1* | 6/2006 | Delgadino et al. ............ 216/67 |
| 2006/0121729 A1* | 6/2006 | Takeshita et al. ............. 438/638 |

* cited by examiner

*Primary Examiner*—Matthew Smith
*Assistant Examiner*—Walter H Swanson
(74) *Attorney, Agent, or Firm*—Andrew D. Fortney (57) ABSTRACT

Disclosed is a method of forming a dual damascene pattern. The method can include forming a first etch stop layer, a first dielectric layer, a second etch stop layer, a second dielectric layer and a cap insulating layer on a substrate, forming a preliminary via hole exposing a part of the first etch stop layer by patterning the insulating layer structure, and forming a sacrificial layer pattern in the preliminary via hole. After forming a mask pattern on the cap insulating layer, a trench is formed by patterning the cap insulating layer, the second dielectric layer and a part of the sacrificial layer. The sacrificial layer pattern and the mask pattern are removed in-situ through an ashing process, thereby forming a via hole.

18 Claims, 8 Drawing Sheets

| | Shibaura CE2000 | | Shibaura CE2000 | HPT In-situ Strip | | |
|---|---|---|---|---|---|---|
| | 1Step | 2Step | | 1Step | 2Step | 3Step |
| Pressure(mT) | 79 | 42 | 1000 | 60 | 60 | 310 |
| Microwave (W) | 0 | 2000 | 2500 | - | - | - |
| 27.12MHz (W) | - | - | - | 300 | 300 | 300 |
| Bias Power (W) | 400 | 50 | 200 | 100 | 100 | 0 |
| CF4 (sccm) | - | - | - | 5 | 0 | 0 |
| O2 (sccm) | 250 | 300 | 2500 | 400 | 400 | 2000 |
| N2 (sccm) | - | - | 250 | 100 | 100 | 0 |
| Time (sec) | 120 | 75 | 140 | 10 | 30 | 60 |

| FCT standard | POR Process | Remove through in-situ process (Processed in single chamber) | Remove in-situ process (Processed in trench and asher chambers) |
|---|---|---|---|
| Process time/ 1wafer | Trench etch : 90 sec<br>Asher : 190 sec<br>280 sec w/o movement | 190 sec | Trench etch : 90 sec<br>Asher : 100 sec<br>190 sec w/o movement |
| Process time/ 1wafer | ~120 min w/o movement | ~80 min w/o movement | ~45 min w/o movement |

METHOD OF FORMING DUAL DAMASCENE PATTERN

BACKGROUND OF THE INVENTION

1. Field of the Invention

The present invention relates to a semiconductor device. More particularly, the present invention relates to a method of forming a dual damascene pattern.

2. Description of the Related Art

According to Moore's law, the integration degree of a semiconductor device may increase two times every year. Such an increase of the integration degree in semiconductor chips leads to micro-sized transistors and interconnections.

As the interconnections are fabricated in a micro-size, resistance R and capacitance C between interconnections are increased, so that the RC delay time is lengthened. Such an increase of the RC delay time causes degradation of the response speed and performance of the semiconductor device.

Recently, metal interconnections are fabricated by using copper having resistance lower than that of aluminum in order to reduce parasitic capacitance between metal interconnections. In addition, instead of an interlayer dielectric layer including silicon oxide ($SiO_2$, k≈4.2), an interlayer dielectric layer including one or more low-k materials, such as FSG (fluorinated silicate glass, k≈3.7) or OSG (organosilicate glass, k≈2.8) may be used so as to reduce parasitic capacitance between metal interconnections.

Different from an aluminum interconnection process, a copper interconnection is fabricated through a dual damascene process. According to the dual damascene process, a low-k insulating layer formed at an interconnection area is removed through an etching process by using a PR (photoresist) mask, and then a metallic interconnection material (Cu) is filled therein.

According to the dual damascene process, via holes and trenches are formed in the low-k insulating layer, and then a PR film used for forming the via holes and/or trenches is removed in order to form the metal interconnections. The PR removal process aims not only to remove the PR film, but also to reduce damage of the interlayer dielectric layer and to minimize polymer residues remaining in the via holes and/or trenches while preventing an oxide layer from being formed on the copper interconnection. In particular, when the PR removal process is performed at a high temperature, the interlayer dielectric layer may be damaged or the oxide layer may be formed on the copper interconnection. For this reason, the PR removal process is generally performed at a low temperature (e.g., 20 to 25° C.) when the copper interconnection process is carried out. After the PR removal process, particles may be introduced onto a wafer. In this case, the characteristics of the semiconductor device may be degraded. In addition, since the PR removal process takes a relatively long time as compared to the via bole/trench forming process, the overall process time is lengthened.

Hereinafter, a conventional dual damascene process will be described with reference to accompanying drawings.

Figure 1A:
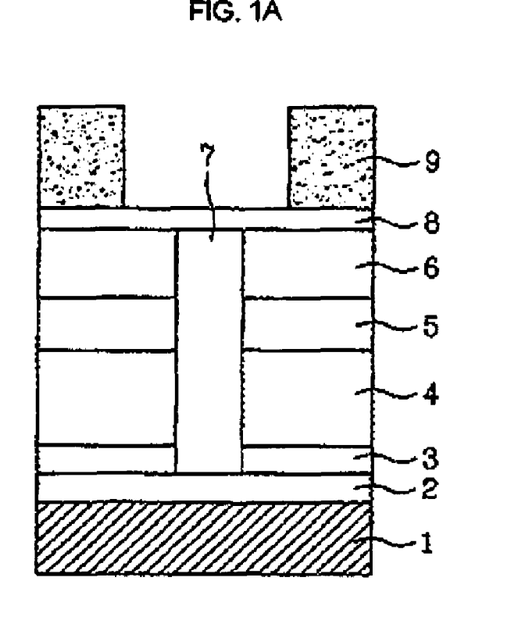
FIGS. 1A to 1C are sectional views illustrating the procedure of a conventional dual damascene process.
Figure 1B:
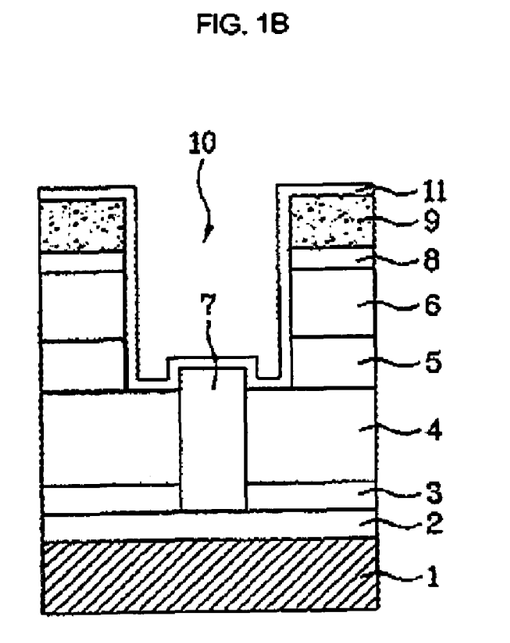
Figure 1C:
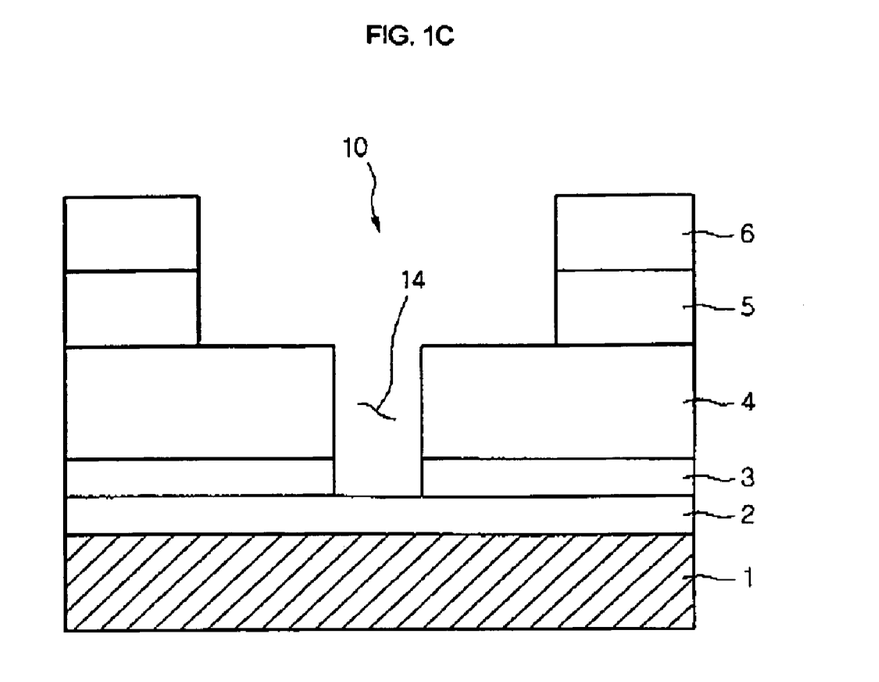
Figure 2:
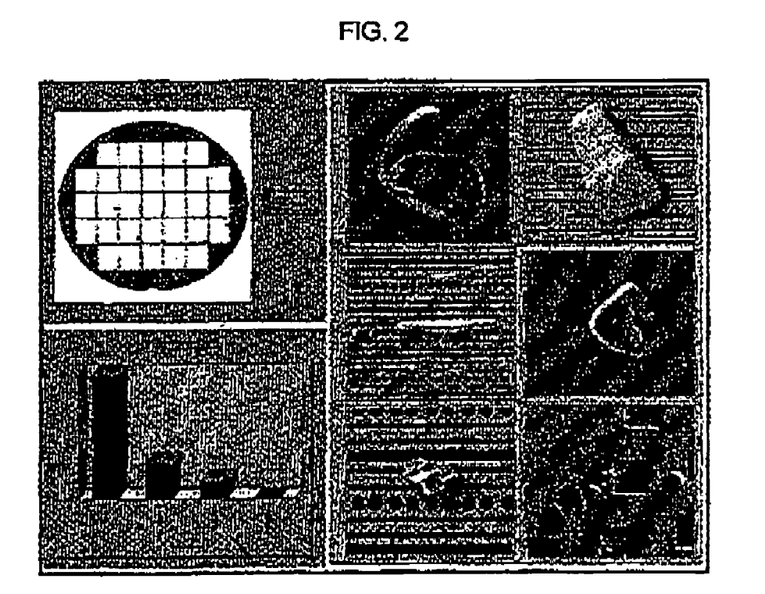
FIG. 2 is a view illustrating an SEM image of particles generated after the conventional ashing process has been performed.

FIGS. 1A to 1C are sectional view showing the conventional dual damascene process, and FIG. 2 is a view showing an SEM image of particles, which are generated when a conventional asher apparatus is used.

Referring to FIG. 1A, a first etch stop layer 2, a first interlayer dielectric layer 3, a second etch stop layer 4, a second interlayer dielectric layer 5, and a cap insulating layer 6 are sequentially formed on a substrate 1.

The first etch stop layer 2 includes a nitride layer used as a barrier layer, and the second interlayer dielectric layer 5 includes FSG (fluorinated silicate glass) or OSG (organosilicate glass).

After sequentially forming the above layers 2 to 6 on the substrate 1, a first PR film is coated on the cap insulating layer 6. Then, the PR film is selectively patterned, thereby forming a first PR pattern for exposing a part of the cap insulating layer 6.

Then, the cap insulating layer 6, the second interlayer dielectric layer 5, the second etch stop layer 4 and the first interlayer dielectric layer 3 are sequentially etched by using the first PR pattern as a mask, thereby forming a via hole having a first width such that the first etch stop layer 2 can be exposed through the via hole.

After that, the first PR film, which is aligned on the cap insulating layer 6 to form the via hole, is removed. Then, a bottom antireflection coating (BARC) layer is formed in the via hole and a planarization process is performed such that the BARC layer remains only in the via hole, thereby forming a sacrificial layer 7 in the via hole.

Subsequently, after forming a BARC layer 8 on the entire surface of the resultant structure, a second PR film 9 is formed on the BARC layer 8. Then, the second PR film 9 is patterned such that a part of the BARC layer 8 can be exposed.

After that, as shown in FIG. 1B, the BARC layer 8, the cap insulating layer 6 and the second interlayer dielectric layer 5 are patterned by using the second PR film 9 as an etch mask, thereby forming a trench 10 extending through the BARC layer 8, the cap insulating layer 6 and the second interlayer dielectric layer 5. At this time, a polymer layer 11, which is a byproduct created during the trench forming process, can be formed on the surfaces of the trench 10 and the second PR film 9.

Referring to FIG. 1C, after the trench 10 has been formed, the substrate 1 is loaded into an usher apparatus so as to remove the second PR film 9, the polymer layer 11, the BARC layer 8, and the sacrificial layer 7 from the substrate 1. Accordingly, the second PR film 9, the polymer layer 11, the BARC layer 8, and the sacrificial layer 7 are sequentially removed from the substrate 1 in the usher apparatus, so that the via hole 14 and the french 10 are formed.

As mentioned above, according to the conventional damascene process, the trench forming process for forming the trench in the layers provided on the substrate 1 is performed separately from the asher process for removing the PR film.

The asher apparatus for performing the ashing process removes the PR film through a downstream scheme by using a microwave (2.45 GHz) or an ICP (inductively coupled plasma) source.

Such an asher apparatus generally uses a waveguide and an RF antenna, and also uses a chamber having an increased volume in order to realize the downstream scheme in the chamber, so particles may be generated in the chamber. In addition, since the trench forming process and the PR removal process are performed in different chambers, the manufacturing steps may be relatively high.

The conventional asher apparatus performs the ashing process through two steps or one step. In particular, if the ashing process is performed through two steps, the second PR film is partially removed during the first step by generating plasma using a bias power, and then the remaining part of the second PR film and the sacrificial layer are removed during the second step by using the microwave downstream.

However, in order to remove the second PR film and the sacrificial layer by using the microwave downstream, the chamber of the asher apparatus must have a large volume, which may cause particles in the chamber.

For instance, if the ashing process is performed by using the asher apparatus having a large-sized chamber, as shown in FIG. 2 illustrating SEM (scanning electron microscope) images of devices processed in such a chamber, a plurality of particles may be generated in the chamber. The particles may cause a short circuit in the copper layer when the copper layer is subjected to a chemical mechanical polishing (CMP) process.

In addition, in order to form the trench after forming the via hole, the conventional dual damascene process patterns the PR film or the sacrificial layer including the BARC layer after filling the via hole with the PR film or the sacrificial layer. In this case, however, the sacrificial layer is not always completely removed from the via hole, so that residues of the sacrificial layer may remain in the via hole.

SUMMARY OF THE INVENTION

The present invention has been made to solve the above problem occurring in the related art, and an object of the present invention is to provide a method of forming a dual damascene pattern capable of improving productivity and reliability of semiconductor devices by shortening the process time and reducing particles.

In order to accomplish the above object, the present invention provides a method of forming a dual damascene pattern, the method comprising the steps of: forming a preliminary via hole exposing a part of a first etch stop layer under an insulating layer structure comprising a first dielectric layer, a second etch stop layer, and a second dielectric layer (generally by patterning the insulating layer structure); forming a sacrificial layer pattern in the preliminary via hole; forming a mask pattern on the insulating layer structure; forming a trench exposing the second etch stop layer by patterning the second dielectric layer and a part of the sacrificial layer, using the mask pattern as an etch mask; and removing the sacrificial layer pattern in the preliminary via hole and the mask pattern in-situ through an ashing process, thereby forming a via hole. The method may further comprise forming the insulating layer structure by sequentially forming the first etch stop layer, the first dielectric layer, the second etch stop layer, and the second dielectric layer (and optionally, a cap insulating layer) on a substrate.

The first etch stop layer may include a (barrier) nitride layer, and the second dielectric layer may include FSG (fluorinated silicate glass, k=3.7) or OSG (organosilicate glass, k=2.8).

The sacrificial layer pattern may include a photoresist film or BARC (bottom antireflection coating).

The trench etching process and the ashing process can be performed using a CCP (capacitively coupled plasma) scheme comprising a confined plasma etch system including a chiller, such as the High Performance Turbo (HPT) apparatus commercially available from LAM Research, Fremont, Calif., capable of performing the trench etching and ashing process in a single chamber.

The dual damascene trench ashing process can be performed using three substeps, in which a first substep is performed for about 10 seconds under conditions comprising a pressure of about 60 mT, a radio frequency (RF) of about 27.12 MHz at a power of about 300 W, a bias power of about 100 W, a $CF_4$ gas flow of about 5 sccm, $O_2$ gas flow of about 400 sccm, and $N_2$ gas flow of about 400 sccm. A second step is performed for about 30 seconds under conditions comprising a pressure of about 60 mT, an RF of about 27.12 MHz at a power of about 300 W, bias power 100 W, an $O_2$ gas flow of about 400 sccm, and an $N_2$ gas flow of about 400 sccm. A third step is performed for 60 seconds under conditions of pressure 310 mT, an RF of about 27.12 MHz at a power of about 300 W, and an $O_2$ gas flow of about 2000 sccm.

The ashing process may be performed at a pressure of about 60 mTorr, while applying a power of about 100 W.

DETAILED DESCRIPTION OF THE PREFERRED EMBODIMENTS

Hereinafter, a method of forming a dual damascene pattern according to preferred embodiments of the present invention will be described with reference to the accompanying drawings.

Figure 3A:
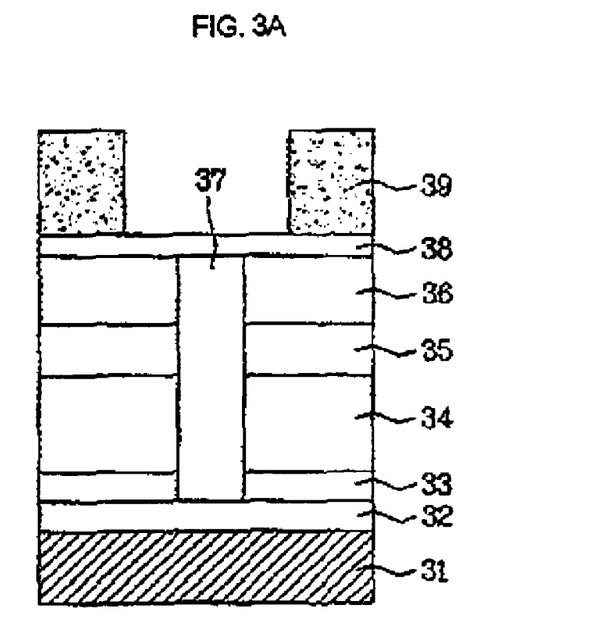
FIGS. 3A to 3C are sectional views illustrating the procedure of a dual damascene process according to an exemplary embodiment of the present invention.

Referring to FIG. 3A, at least two insulating structures are sequentially formed on a substrate 31. For instance, the insulating structures may include a first etch stop layer 32, a first dielectric layer (which may also be known as a first interlayer dielectric layer), and a second etch stop layer, which are sequentially formed on the substrate 31. In addition, a second dielectric layer (which may also be known as a second interlayer dielectric layer) and a cap insulating layer can be sequentially formed on the second etch stop layer. However, in one aspect of the invention, the insulating layer structure and/or second dielectric layer may further comprise the cap insulating layer.

The first etch stop layer 32 serves as an etch stop layer, and may serve as a barrier layer. For instance, the first etch stop layer 32 may include a nitride layer (e.g., silicon nitride). The first and/or second dielectric layer, for example, may include a low-k material (e.g., having a dielectric constant of about 2.8 to 3.8). Thus, the first and/or second dielectric layer may include materials such FSG (fluorinated silicate glass, k≈3.7) or OSG (organosilicate glass, k≈2.8; e.g., a silicon dioxide formed by chemical vapor deposition from an organosilicon compound such as tetraethyl orthosilicate, or TEOS).

Then, a first PR film including a PR material is formed on the cap insulating layer. The first PR film is patterned through a photo process including an exposure and development process, so that a first PR pattern (not shown) exposing a part of the cap insulating layer is formed on the cap insulating layer.

After the first PR pattern has been formed, the cap insulating layer, the second interlayer dielectric layer, the second etch stop layer and the first interlayer dielectric layer are etched by using the first PR pattern as an etch mask, so that a cap insulating layer pattern 36, a second interlayer dielectric layer pattern 35, a second etch stop layer pattern 34, and a first interlayer dielectric layer pattern 33, which have preliminary via holes, respectively, are formed. After the preliminary via holes have been formed, the first PR pattern is removed.

Then, a PR film or a BARC layer, which serves as a sacrificial layer, is formed (e.g., by conventional deposition, such as by spin-coating) in the preliminary via hole in the cap insulating layer pattern 36, the second dielectric layer pattern 35, the second etch stop layer pattern 34, and the first dielectric layer pattern 33. In addition, the PR film or the BARC layer is also generally formed on the top surface of the cap insulating layer pattern 36. The BARC layer may comprise an organic BARC layer.

After that, the sacrificial layer formed on the top surface of the cap insulating layer pattern 36 may be planarized using a chemical mechanical polishing process, so that a sacrificial layer pattern 37 is formed in the preliminary via hole.

After the sacrificial layer pattern 37 has been formed in the preliminary via hole, a BARC layer 38 and a second PR layer (not shown) are sequentially formed on the entire top surface of the insulating layer structure (e.g., the cap insulating layer pattern 36) where the sacrificial layer pattern 37 has been removed.

Then, the second PR layer is patterned through a photolithography process including exposure and development processes, so that a second PR pattern 39 is formed. A part of the BARC layer 38 is exposed through the opening formed in the second PR pattern 39. According to the present invention, a sectional area (or width) of the opening formed in the second PR pattern 39 is larger than that of the preliminary via hole.

Figure 3B:
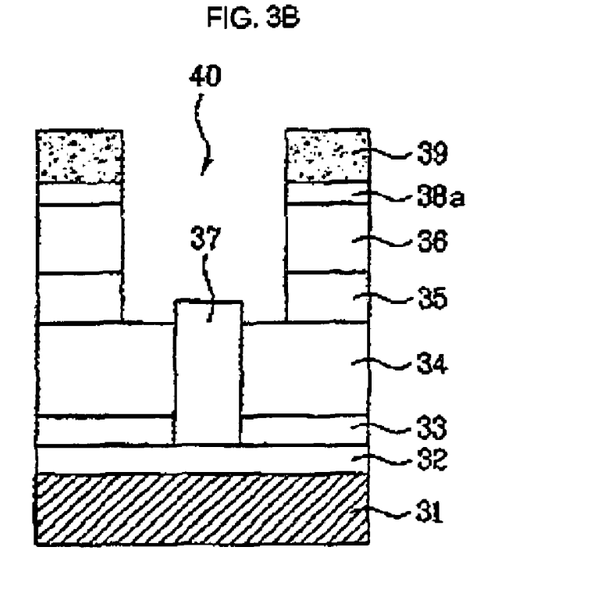

Referring to FIG. 3B, the BARC layer 38, the cap insulating layer pattern 36, the second interlayer dielectric layer pattern 35, and a portion of the sacrificial layer pattern 37 are patterned through an etching process, so that a trench 40 is formed on the second etch stop layer pattern 34. At this time, the second PR pattern 39 is used as an etch mask. While the trench 40 is being formed, the BARC layer 38 is patterned so that a BARC pattern 38a is formed.

The BARC layer 38 and the BARC pattern 38a absorb light, thereby preventing scattered reflection.

Figure 3C:
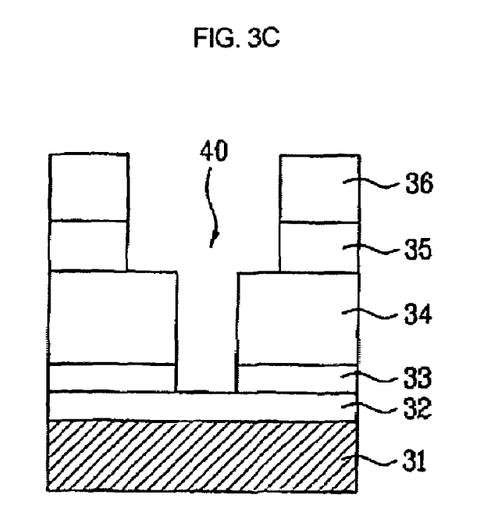

Referring to FIG. 3C, after the trench 40 has been formed, the second PR pattern 39 and the BARC pattern 38a, and the sacrificial layer pattern 37 (the latter of which is exposed through the trench 40) are removed in the same apparatus that performs the ashing process in-situ, so that a dual damascene structure having the via hole and the trench may be obtained.

Meanwhile, in order to reduce or prevent residues from parts of the second PR pattern 39, the BARC pattern 38a, and/or the sacrificial layer pattern 37 from remaining in the preliminary via hole, the ashing process is preferably performed under a low pressure condition. According to an embodiment of the present invention, the ashing process may be performed at a pressure of 30 mT to 60 mT.

After the trench and the via hole have been formed, a copper seed layer may be formed in the trench and the via hole, generally by chemical vapor deposition, physical vapor deposition, and/or electroplating. Formation of the copper seed layer may follow deposition of one or more adhesion promoter and/or diffusion barrier layers, such as titanium, titanium nitride, tantalum, tantalum nitride, and bilayers thereof (e.g., titanium/titanium nitride, tantalum/tantalum nitride). In addition, copper is deposited on the copper seed layer (e.g., by electroplating) so that a copper layer is formed. The copper layer formed on the cap insulating layer pattern 36 is planarized using a chemical mechanical polishing process, so that a copper interconnection is formed in the via hole and the trench.

Meanwhile, the etching process for forming the trench, and the ashing process for removing the second PR pattern 39, the BARC pattern 38a and the sacrificial layer pattern 37 are performed in-situ in the confined plasma etching apparatus.

Since the confined plasma etching apparatus performs the process through a CCP (capacitively coupled plasma) scheme at a relatively low temperature using a chiller, the etching process and the ashing process can be performed in a single chamber.

Figure 4:
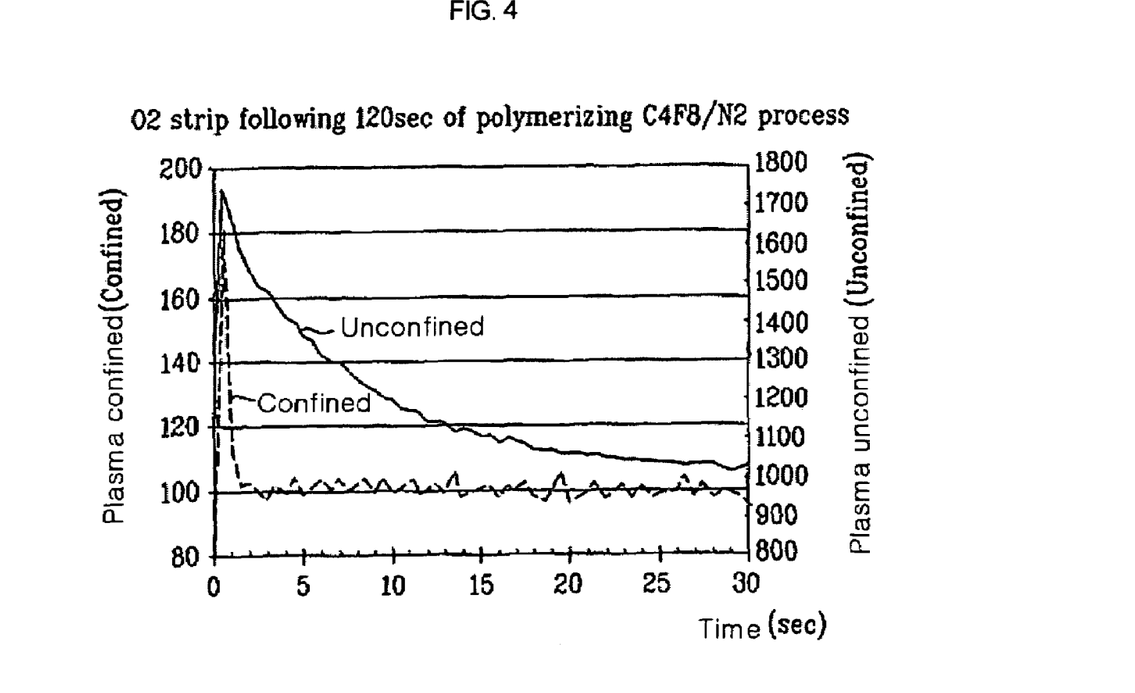
FIG. 4 is a graph showing a memory effect caused by fluorine according to the present invention.

In addition, since the confined plasma etching apparatus limits the plasma area by using a confinement ring, a short residence time in the chamber and/or a fast polymer removal rate can be obtained. Thus, as shown in FIG. 4, the memory effect caused by residual fluorine remaining in the etching/ashing chamber may not occur (compare the "Confined" curve representative of the present invention [left-hand axis] with the "Unconfined" curve representative of the related art [right-hand axis]).

Figure 5:
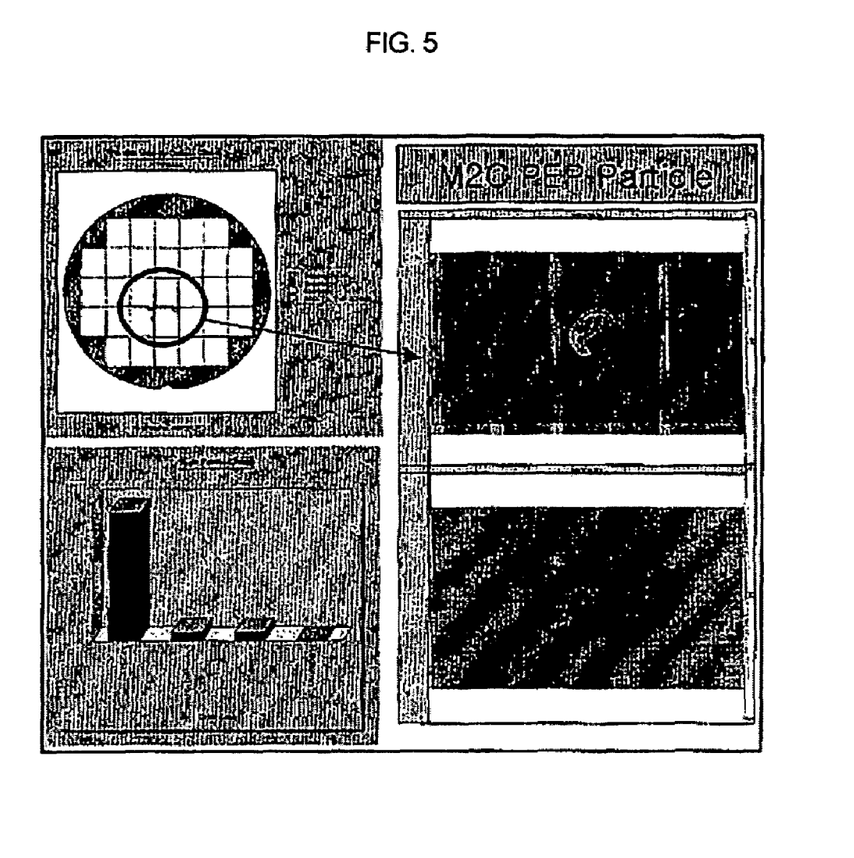
FIG. 5 is a view illustrating an SEM image of particles generated after an ashing process has been performed using a confined plasma etching apparatus according to the present invention.

In addition, since the plasma area may be limited, as shown in FIG. 5, the amount of particles can be significantly reduced when the trench etching process and the ashing process are performed using a confined plasma etching apparatus.

Figure 6:
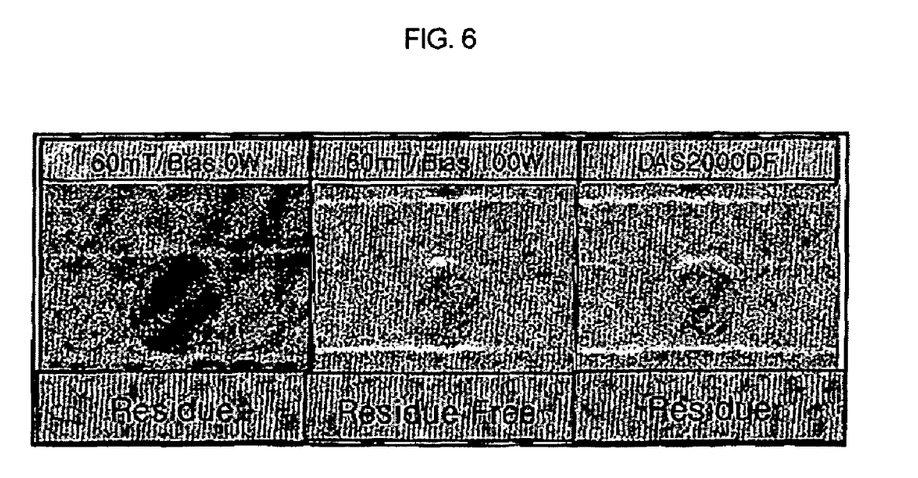
FIG. 6 is a view illustrating various residues formed in various devices, depending on pressure and bias power when the dual damascene pattern is formed according to the present invention.

If the trench etching process and the ashing process are performed in-situ under a low pressure condition (e.g., about 60 mTorr) while applying a power of about 100 W, as shown in FIG. 6, residues may remain on the bottom of the via hole.

Figure 7:
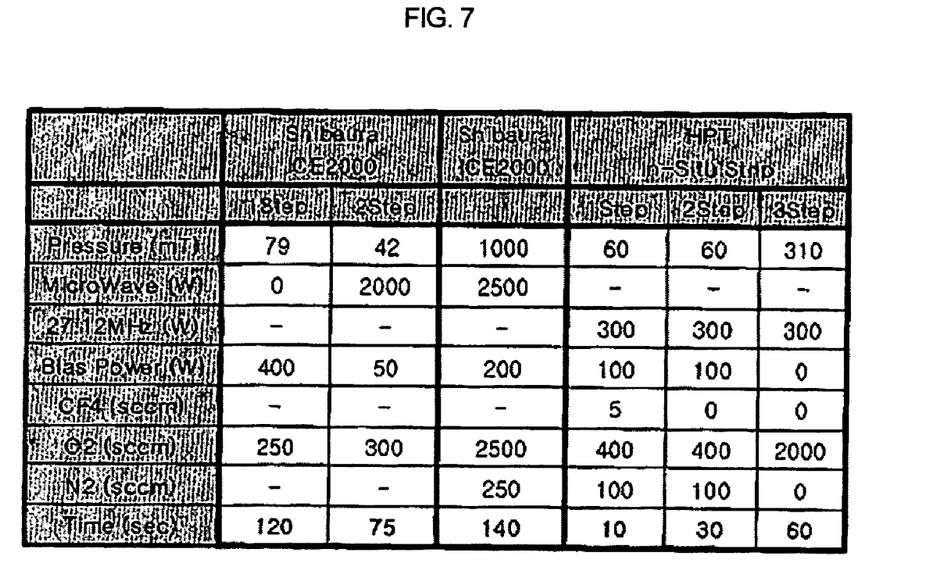
FIG. 7 is a table showing conditions of the ashing process between the related art and the present invention.

As shown in FIG. 7, the confined plasma etching apparatus according to the present invention may perform the etching process and the ashing process using three substeps.

The first step may be performed for about 10 seconds under conditions comprising a pressure of about 60 mT, a radio frequency (RF) of 27.12 MHz at a power of about 300 W, a bias power of about 100 W, $CF_4$ gas 5 sccm, an $O_2$ gas flow of about 400 sccm, and a $N_2$ gas flow of about 400 sccm.

The second step is performed for about 30 seconds under conditions comprising a pressure of about 60 mT, an RF of 27.12 MHz at a power of about 300 W, a bias power of about 100 W, an $O_2$ gas flow of about 400 sccm, and a $N_2$ gas flow of about 400 sccm.

The third step is performed for about 60 seconds under conditions comprising a pressure of about 310 mT, an RF of 27.12 MHz at a power of about 300 W, and an $O_2$ gas flow of about 2000 sccm.

That is, a plasma formed from $CF_4/O_2/N_2$ gases may be used to remove the second PR film and the sacrificial layer.

Figure 8A:
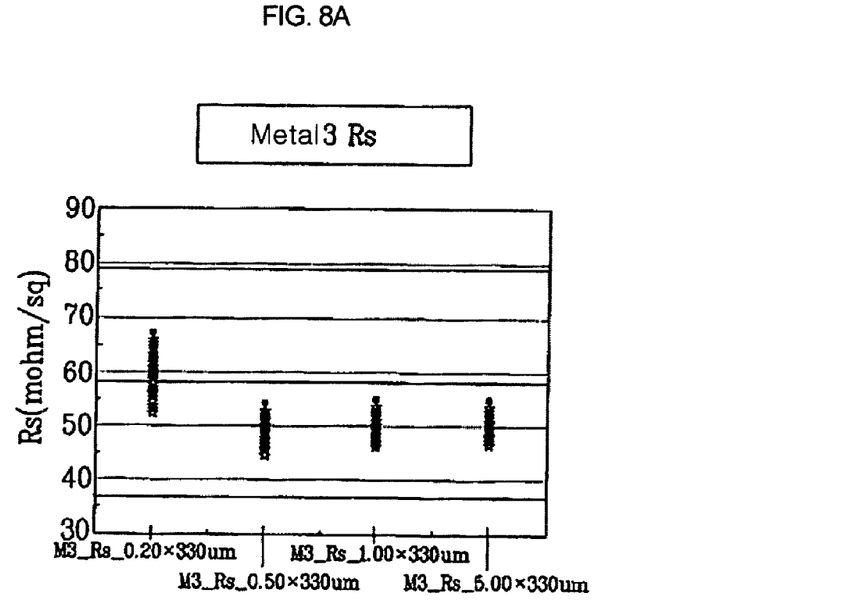
FIGS. 8A and 8B are graphs illustrating metal sheet resistance in devices representative of the related art and the present invention.
Figure 8B:
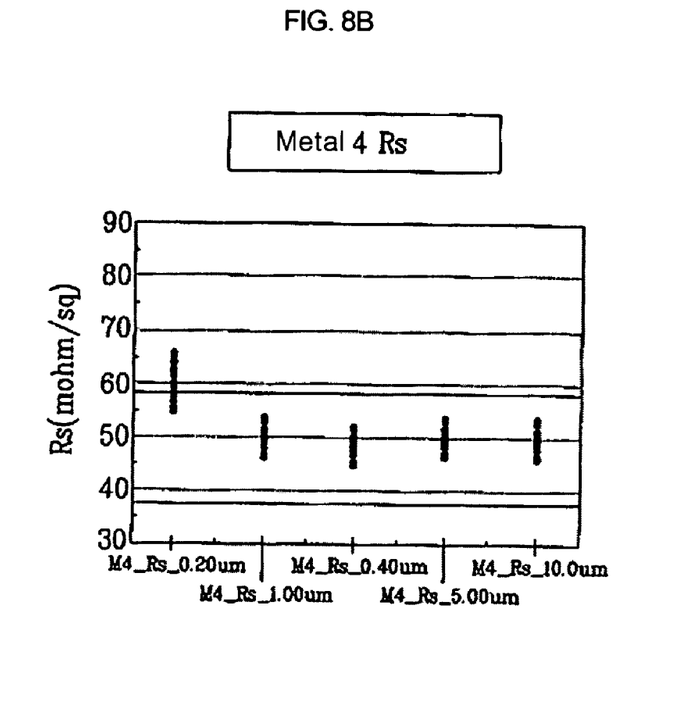

The $CF_4$ gas is used to etch oxide layers and a lower portion of the trench, which is not covered with the PR film, during the ashing process, thereby preventing residues from remaining on the bottom of the trench. As shown in FIGS. 8A and 8B, although the present invention employs the $CF_4$ gas, metal sheet resistance Rs according to designs of the present invention is stable similar to that of the related art.

Figure 9:
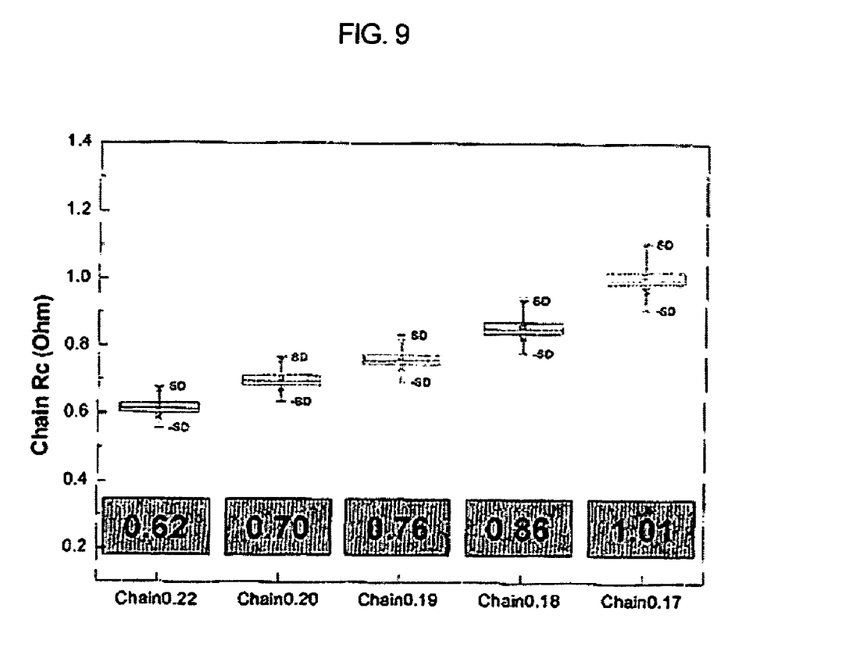
FIG. 9 is a graph showing chain resistance caused by residues remaining in a via hole.

In addition, as shown in FIG. 9, via chain resistance according to the design of the via hole is stably represented. Accordingly, an increase of the via chain resistance and an incidence of via open failures that may be caused by the residues remaining in the via hole are reduced or generally do not occur.

In this manner, since the trench etching process and the ashing process are performed in-situ in the single chamber, a stable metal Rs and via Rc can be obtained.

Figure 10:
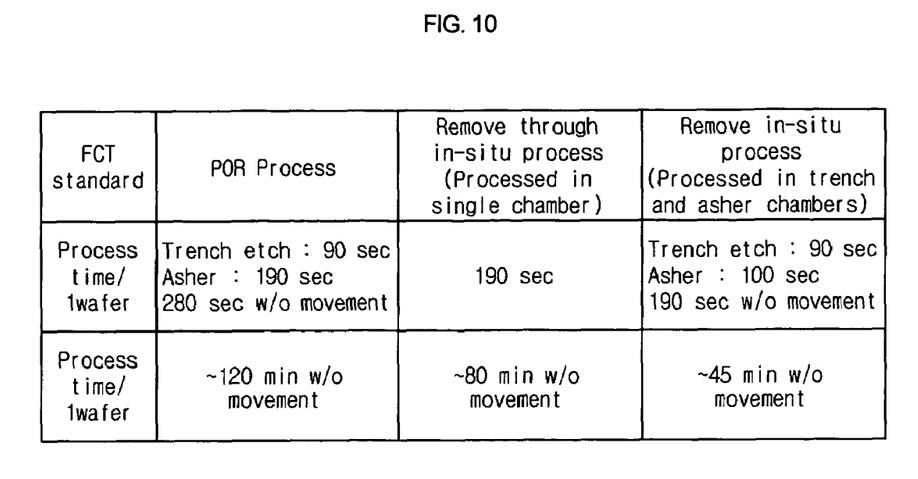
FIG. 10 is a table showing process times according to an in-situ strip process.

As shown in FIG. 10, according to the related art, the process time of the etching process is about 90 seconds, the process time of the ashing process is about 190 seconds, and the wafer moving time from the etching apparatus to the asher apparatus is about 280 seconds.

In contrast, according to the present invention, the process time of the etching process is about 90 seconds, the process time of the ashing process is about 100 seconds, and the wafer moving time is about 190 seconds when the trench etching process and the ashing process are performed in different chambers using a confined plasma etching apparatus. That is, the present invention can improve productivity and/or throughput as compared with the process of the related art.

In addition, the combined process time of the etching process, the ashing process, and the wafer moving time are about 190 seconds when the etching process and the ashing process are performed in the single chamber by using the confined plasma etching apparatus according to the present invention.

It can be understood from the above results that the process time can be shortened as compared with the process of the related art even if the trench etching process and the ashing process are performed in separate chambers in the confined plasma etching apparatus according to the present invention. In addition, the process time can be further shortened if the trench etching process and the ashing process are performed in a single chamber by using the confined plasma etching apparatus.

The reduction of the process time leads to an increase of process capacity without additional costs for the ashing apparatus, so cost competitiveness can be ensured.

As mentioned above, the present method of forming a dual damascene pattern has the following advantages.

First, since the trench etching process and the ashing process may be performed in-situ in the single chamber, the process time can be shortened and the cost competitiveness can be ensured.

Second, since the trench etching process and the ashing process can be performed in-situ in a single chamber, etch residues may be prevented from remaining in the via hole so that reliability of the semiconductor device can be improved.

It will be apparent to those skilled in the art that various modifications and variations can be made in the present invention. Thus, it is intended that the present invention covers the modifications and variations thereof within the scope of the appended claims.

What is claimed is:

1. A method of forming a dual damascene pattern, the method comprising the steps of:
    forming a preliminary via hole exposing a part of a first etch stop layer in an insulating layer structure comprising a first dielectric layer, a second etch stop layer, and a second dielectric layer on the first etch stop layer;
    forming a sacrificial layer in the preliminary via hole;
    forming a mask pattern on the insulating layer structure;
    forming a trench exposing the second etch stop layer and the sacrificial layer by patterning the second dielectric layer and a part of the sacrificial layer using the mask pattern as an etch mask in an etching apparatus; and
    forming a via hole by removing the sacrificial layer pattern in the preliminary via hole and the mask pattern in-situ through an ashing process using the same etching apparatus, wherein the ashing process comprises treating the substrate with a first plasma phase from a first gas mixture comprising $CF_4$, oxygen and nitrogen gases, treating the substrate with a second plasma phase from a second gas mixture comprising oxygen and nitrogen gases, and treating the substrate with a third plasma phase from oxygen.

2. The method as claimed in claim 1, wherein the first etch stop layer includes a nitride layer.

3. The method as claimed in claim 1, wherein the second dielectric layer has a dielectric constant of about 2.8 to about 3.7.

4. The method as claimed in claim 3, wherein the second dielectric layer includes FSG (fluorinated silicate glass) or OSG (organosilicate glass).

5. The method as claimed in claim 1, wherein the sacrificial layer pattern includes a photoresist film or a bottom antireflection coating (BARC).

6. The method as claimed in claim 1, wherein the ashing process is performed at a pressure in a range of from about 60 mTorr to about 100 mTorr.

7. The method as claimed in claim 1, wherein the ashing process comprises applying a bias power in a range of from about 50 W to about 150 W.

8. The method as claimed in claim 1, further comprising a step of forming a BARC layer on a top surface of the insulating layer structure.

9. The method as claimed in claim 1, wherein the trench forming step and the via hole forming step are performed in a single chamber of the etching apparatus.

10. The method as claimed in claim 1, wherein the trench forming step is performed in a first chamber of the etching apparatus and the via hole forming step is performed in-situ in a second chamber of the etching apparatus connected to the first chamber.

11. The method as claimed in claim 1, further comprising, after forming the trench and the via hole, etching the exposed first etch stop layer to expose a portion of an underlying metallization layer.

12. The method as claimed in claim 1, further comprising, after forming the trench and the via hole, forming a copper seed layer in the trench and the via hole.

13. The method as claimed in claim 12, further comprising, after forming the copper seed layer, depositing a copper layer on the copper seed layer.

14. The method as claimed in claim 13, further comprising, removing the copper layer over the insulating layer structure, thereby forming a copper interconnection in the trench and the via hole.

15. The method as claimed in claim 1, wherein forming the trench and the via hole comprise using a confined plasma etching apparatus employing a CCP (capacitively coupled plasma).

16. The method as claimed in claim 1, further comprising sequentially forming the first etch stop layer, the first dielectric layer, the second etch stop layer, and the second dielectric layer on a substrate.

17. The method as claimed in claim 1, wherein the insulating layer structure further comprises a cap insulating layer on the second etch stop layer.

18. A method of forming a dual damascene pattern, the method comprising the steps of:
    forming a preliminary via hole exposing a part of a first etch stop layer in an insulating layer structure comprising a first dielectric layer, a second etch stop layer, and a second dielectric layer on the first etch stop layer;
    forming a sacrificial layer in the preliminary via hole;

forming a mask pattern on the insulating layer structure;
forming a trench exposing the second etch stop layer by patterning the second dielectric layer and a part of the sacrificial layer using the mask pattern as an etch mask in an etching apparatus; and
forming a via hole by removing the sacrificial layer pattern in the preliminary via hole and the mask pattern in-situ through an ashing process using the etching apparatus, wherein the ashing process comprises a first substep performed for about 10 seconds at a pressure of about 60 mT, a radio frequency (RF) of about 27.12 MHz at a power of about 300 W, a bias power of about 100 W, a $CF_4$ gas flow of about 5 sccm, an $O_2$ gas flow of about 400 sccm, and a $N_2$ gas flow of about 400 sccm, a second substep performed for about 30 seconds at a pressure of about 60 mT, an RF of about 27.12 MHz at a power of about 300 W, a bias power of about 100 W, an $O_2$ gas flow of about 400 sccm, and a $N_2$ gas flow of about 400 sccm, and a third substep performed for about 60 seconds at a pressure of about 310 mT, an RF of about 27.12 MHz at a power of about 300 W, and $O_2$ gas flow of about 2000 sccm.

\* \* \* \* \*